(12) United States Patent
Meade et al.

(10) Patent No.: US 7,042,286 B2
(45) Date of Patent: May 9, 2006

(54) SIGNAL CORRECTION TECHNIQUES

(75) Inventors: Steven Anthony Meade, Bristol (GB); Richard Michael Bennett, Bristol (GB); Antony James Smithson, North Yorkshire (GB)

(73) Assignee: Andrew Corporation, Orland Park, IL (US)

( * ) Notice: Subject to any disclaimer, the term of this patent is extended or adjusted under 35 U.S.C. 154(b) by 70 days.

(21) Appl. No.: 10/480,895

(22) PCT Filed: Jun. 11, 2002
(Under 37 CFR 1.47)

(86) PCT No.: PCT/GB02/02670

§ 371 (c)(1),
(2), (4) Date: May 19, 2004

(87) PCT Pub. No.: WO02/103896

PCT Pub. Date: Dec. 27, 2002

(65) Prior Publication Data
US 2004/0232984 A1    Nov. 25, 2004

(30) Foreign Application Priority Data
Jun. 15, 2001   (GB)   ................... 0114804.8

(51) Int. Cl.
*H03F 1/26*   (2006.01)

(52) U.S. Cl. ...................... 330/149; 330/136

(58) Field of Classification Search ................. 330/136; 375/297
See application file for complete search history.

(56) References Cited

U.S. PATENT DOCUMENTS

| | | | |
|---|---|---|---|
| 5,396,190 A | 3/1995 | Murata | 330/149 |
| 5,870,668 A | 2/1999 | Takano et al. | 455/126 |
| 5,949,283 A | 9/1999 | Proctor et al. | 330/149 |
| 2001/0007435 A1* | 7/2001 | Ode et al. | 330/149 |

FOREIGN PATENT DOCUMENTS

| | | |
|---|---|---|
| EP | 0 731 556 A1 | 9/1996 |
| EP | 1 011 192 A2 | 6/2000 |
| WO | WO 98/12800 | 3/1998 |
| WO | WO 99/05869 | 2/1999 |

OTHER PUBLICATIONS

"Adaptive Linearization Using Pre-Distortion," by Michael Faulkner et al., Vehicular Technology Conference, Orlando, May 6-9, 1999, New York, IEEE, US, vol. Conf. 40, pp. 35-40, XP000203781.

"A Digital Approach to Efficient RF Power Amplifier Linearization," Global Telecommunications Conference, 1997, Globcom '97., IEEE Phoenix, AZ, USA, Nov. 3-8, 1997, New York, NY, USA, IEEE, US, pp. 77-81, XP010254627.

"Error Sensitivity in Adaptive Predistortion Systems," by Paolo Banelli, IEEE Global Telecommunications Conf, 1999, the whole document, XP010373672.

* cited by examiner

*Primary Examiner*—Steven J. Mottola
(74) *Attorney, Agent, or Firm*—Steve Mendelsohn

(57) ABSTRACT

Errors present in the output of an amplifier (10) are compared with the amplifier input in a control unit (24) to derive corrected coefficients for a look-up table used by predistorter (12) to eliminate distortion in the output of the amplifier (10). Depending on the format of the predistorter (12), at least some of the coefficients are corrected using measured errors that have been rendered independent of the input signal's amplitude.

33 Claims, 3 Drawing Sheets

SIGNAL CORRECTION TECHNIQUES

FIELD OF THE INVENTION

BACKGROUND OF THE INVENTION

The invention relates to methods of, and apparatus for, controlling distortion counteracting equipment such as a predistorter.

SUMMARY OF THE INVENTION

In a case where signal handling equipment distorts a signal upon which it operates, it is known to use a lineariser to reduce distortion in the output signal of the equipment. It is known to perform linearisation adaptively by monitoring errors in the output signal and using information on these errors to adjust the linearisation to reduce the errors as far as possible. Typically, predistorters are used to linearise amplifiers.

One aim of the invention is to provide improvements in the manner in which distortion counteracting equipment, such as a predistorter, is controlled.

According to one aspect, the invention provides apparatus for adapting distortion counteracting equipment, wherein said counteracting equipment employs a group of coefficients to adjust a consequential signal in order to ameliorate distortion in an output signal produced by signal handling equipment in response to an input signal, the apparatus comprising error measuring means for measuring errors in the output signal, modifying means for modifying measured errors to render them less dependent on the input signal's amplitude and correcting means for changing said coefficients by amounts dependent on modified errors.

The invention also consists in a method of adapting a distortion counteracting equipment, wherein said counteracting equipment employs a group of coefficients to adjust a consequential signal in order to ameliorate distortion in an output signal produced by signal handling equipment in response to an input signal, the method comprising measuring errors in the output signal, modifying measured errors to render them less dependent on the input signal's amplitude and changing said coefficients by amounts dependent on modified errors.

In one embodiment, the consequential signal is the input signal to the signal handling equipment and the counteracting equipment is a predistorter.

Thus, the invention improves the ability of distortion counteracting equipment to converge to the best values for the coefficients to optimise the elimination of distortion in the output signal. This is achieved by reducing the dependence of the changes to the coefficients on the input signal amplitude (which can vary greatly, e.g. in the case of CDMA signals), i.e. by reducing the dependence of the coefficients' loop gains on the input signal's amplitude. This means that the coefficients converge equally quickly.

In one embodiment, the coefficients are indexed by a function of the input signal's amplitude such that the input signal's amplitude selects the coefficient or coefficients that are used in the distortion amelioration process at any given time. Preferably, the coefficients are arranged in one or more look-up tables indexed by functions of the input signal's amplitude.

In one embodiment, the measured errors are indexed according to a function of the input signal's amplitude, i.e. the measured errors are tabulated against a function of the input signal's amplitude. For example, measured errors can be obtained for each of a series of values of the function of the input signal's amplitude. Where the coefficients are also indexed against the same function of the input signal's amplitude, it is possible to arrange the adaption process such that a measured error is used in the adaption of the coefficient sharing the same index value.

Where a function, $f(a)$, of the input signal's amplitude, a, is used to index coefficients or errors, the function may be simple, such as $f(a)=k.a$, or more complex, such as $f(a)=k.a^2$ (here, k is an arbitrary constant). In the simplest case, $f(a)=a$.

In one embodiment, errors in a particular parameter are measured and these errors are used to adjust coefficients which act on the same signal parameter.

In one embodiment, the coefficients are segregated into sub-groups, each sub-group for altering a different parameter of the consequential signal. The errors used to adapt coefficients in a sub-group may be errors in the parameter to which the sub-group pertains. For example, where the coefficients fall into amplitude and phase sub-groups, the coefficients in the sub-groups are adapted on the basis of amplitude and phase errors respectively. Where the coefficients fall into sub-groups for orthogonal components, errors in each orthogonal component are used to adapt the coefficients for the respective component.

In one embodiment, the error values are derived over a period of time to reduce the effects of noise on the error values. For example, the error values could be accumulated and averaged over a period of time. The error values may be processed to remove the affects of noise, e.g. by filtering the errors or by fitting them to a curve. Similarly, after adaption, the coefficients may be processed to remove the affects of noise, e.g. by filtering the adapted coefficients or by fitting them to a curve.

Preferably, the modified errors are substantially independent of the input signal's amplitude.

In one embodiment, at least some measured errors are modified by dividing them by the input signal's amplitude to make them substantially independent of the input signal's amplitude. Where a measured error is divided by the input signal's amplitude and the measured errors are indexed by a function of the input signal's amplitude, the measured error can be divided by the amplitude value which indexes that measured error.

In one embodiment, the changes to the coefficients are proportional to modified errors. Preferably, the changes to the coefficients are fractions of the modified errors. Advantageously, the fractions can be changed to optimise the adaption rate of the coefficients. For example, the size of the fractions may depend on the size of the errors such that the smaller the error, the smaller the fraction and the larger the error, the larger the fraction.

The invention also consists in a system comprising distortion counteracting equipment for ameliorating signal distortion in signal handling equipment and comprising adaption apparatus as described above for adapting the counteracting equipment.

The invention has been stated above in terms of methods of adapting distortion counteracting equipment; the invention extends also to programs for performing such methods. These programs could be held in a suitable data store such as a disk or memory.

In a preferred embodiment, the signal handling equipment is equipment for amplifying the input signal to create the output signal, comprising one or more amplifiers.

In the preferred embodiments, the distortion counteracting equipment is a lineariser. In a particularly preferred embodiment, the lineariser is a predistorter and the coefficients are for predistorting the input signal to the signal handling equipment. In another embodiment, the lineariser is a feed-forward lineariser in which the input signal is sensed, modified by the coefficients and combined with the amplifier output to give a linearising effect.

BRIEF DESCRIPTION OF THE DRAWINGS

By way of example only, certain embodiments of the invention will now be described with reference to the accompanying figures, in which.

DETAILED DESCRIPTION

Figure 1:
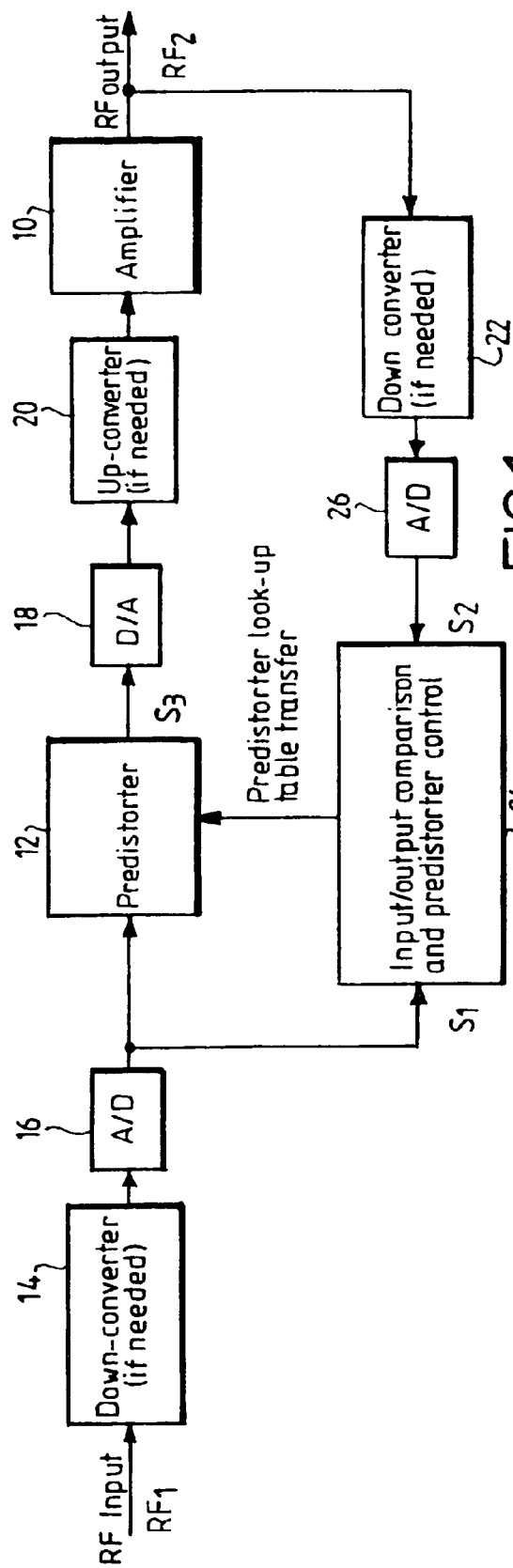
FIG. 1 is a block diagram of a predistorter arrangement operating on an amplifier.

FIG. 1 illustrates an arrangement for predistorting a radio frequency input signal $RF_1$ for an amplifier 10. The input signal $RF_1$ is predistorted in the digital domain using digital predistorter 12 to produce a digitally predistorted input signal $S_3$ for amplifier 10. A downconverter 14 reduces the frequency of the RF input signal $RF_1$ to a frequency supported by the sampling rate at which the predistorter 12 operates. The downconverted input signal is converted to the digital domain by analogue to digital converter (ADC) 16. The predistorted input signal $S_3$ is returned to the analogue domain by digital to analogue converter (DAC) 18 and upconverted to a desired frequency by upconverter 20 prior to being supplied as an input to amplifier 10.

The predistorter 12 can be adapted on the basis of feedback from the output $RF_2$ of amplifier 10. Discrepancies between the actual output $RF_2$ of amplifier 10 and its ideal output are used to adapt the predistortion of the amplifier input signal. The feedback signal is downconverted at downconverter 22 to a signal which is supported by the sampling rate of the digital aspect of the system, comprising predistorter 12 and control unit 24. The output of downconverter 22 is digitised by ADC 26 and supplied to control unit 24 as a feedback signal $S_2$. The control unit 24 uses the digitised feedback signal $S_2$ and the digitised input signal $S_1$ (from ADC 16) to adapt the predistortion.

If the original frequency of the input signal $RF_1$ is not incompatible with the sampling rate of predistorter 12, then downconverter 14 is not needed. If downconverter 14 is absent, then upconverter 20 is not required unless it is desired to shift the predistorted amplifier input signal to a frequency different from that of the original input signal $RF_1$. If the sampling rate of the digital aspect of the system supports the frequency of $RF_2$ then feedback downconverter 22 is not needed. The digitisation performed by ADCs 16 and 26 is performed in such a way as to preserve the amplitude and phase information in the signals being operated upon. For example, if the input to one of the ADCs is at baseband then the signal must be split into two paths with one path being in phase-quadrature to the second path with both paths then being digitised separately.

In this embodiment, the amplitude and phase of signal $S_1$ are modified in the predistorter 12 by the action of look-up tables (LUTs). This can be achieved by using a gain look-up table $L_G$ and a phase look-up table $L_P$, each indexed by a function f of the amplitude $A_1$ of signal $S_1$. Thus, when signal $S_1$ has amplitude $A_1$, value $L_G$ (f($A_1$)) is retrieved from look-up table $L_G$, value $L_P$ (f($A_1$)) is retrieved from look-up table $L_P$ and these values are then used to predistort the signal $S_1$ according to the following equation:

$$S_3 = L_G(f(A_1)) \cdot S_1 \cdot e^{jL_P(f(A_1))}, \text{ where } S_1 = A_1 \cdot e^{ja}$$

Alternatively, predistorter 12 can contain an in-phase LUT $L_I$ and a quadrature phase LUT $L_Q$. Again, these look-up tables are indexed by a function f of the amplitude $A_1$ of signal $S_1$ in order to provide values $L_I$ (f($A_1$)) and $L_Q$ (f($A_1$)), respectively. The retrieved LUT values are then used to predistort the input signal $S_1$ in quadrature format according to the following equation:

$$S_3 = L_I(f(A_1)) \cdot S_1 + j \cdot L_Q(f(A_1)) \cdot S_1, \text{ where } S_1 = A_1 \cdot e^{ja}$$

The function f of the input signal amplitude $A_1$ that is used to index the look-up tables can take any one of a large number of forms. The best form for f in any particular case is dependent on the characteristics of the modulation on the input signal $RF_1$. For example, the two most obvious forms are $f(A_1) = C \cdot A_1$ and $f(A_1) = C \cdot A_1^2$ where C is an arbitrary constant which can be 1.

To adapt the predistortion in response to errors in the output of amplifier 10, the control unit 24 compares the signals $S_1$ and $S_2$ to generate updated LUT values which are transferred to the LUTs in the predistorter 12. Prior to comparison, the signal vectors $S_1$ and $S_2$ are, within control unit 24, time aligned (for example by digitally delaying $S_1$) so as to remove any relative delay difference between them and phase aligned (for example by digitally adjusting the phase of $S_1$ or $S_2$) to eliminate any phase offset between them. These alignment processes enable an accurate comparison of $S_1$ and $S_2$ to allow the error between them and its relationship to the input signal amplitude $A_1$ to be determined independently of the modulation frequency.

Figure 2:
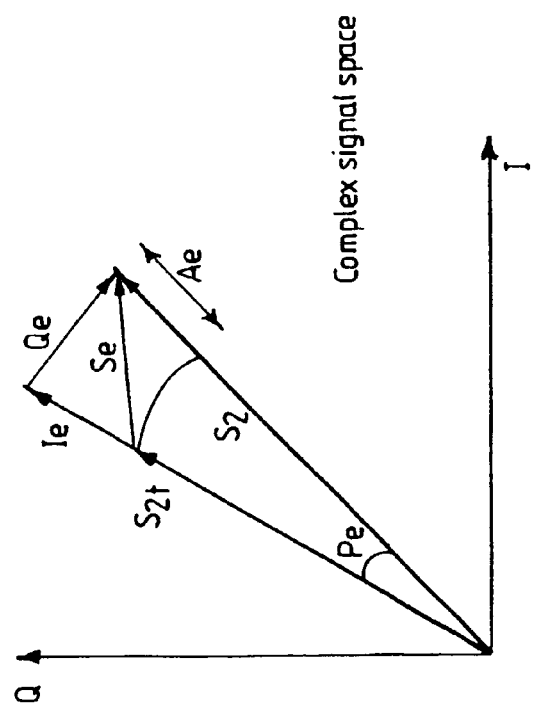
FIG. 2 is a signal space diagram illustrating the discrepancy between ideal and actual output signals for the amplifier undergoing linearisation in FIG. 1.

The ideal or target output signal vector $S_{2t}$ of amplifier 10 is defined as a linear function of the input, i.e. $S_{2t} = G \cdot S_1$ where G is a constant. An error signal vector or error vector $S_e$ is defined as the difference between the measured output signal vector and the target output signal vector, i.e. $S_e = S_2 - S_{2t}$. The error vector $S_e$ is then described in terms of amplitude $A_e$ and phase $P_e$ components or in terms of two orthogonal vectors $I_e$ and $Q_e$ depending on whether the predistorter LUTs are in the amplitude and phase format or the quadrature format respectively. The relationship between the vectors $S_2$, $S_{2t}$ and $S_e$ is shown in the complex signal space diagram of FIG. 2, which also illustrates the components $A_e$, $P_e$, $I_e$ and $Q_e$ of $S_e$ (note that $I_e$ and $Q_e$ are not aligned with the I and Q axes of signal space but rather $I_e$ is parallel to $S_{2t}$).

Thus, as time progresses, various values of $S_e$ (in the appropriate one of the $A_e$, $P_e$ and $I_e$, $Q_e$ formats) are recorded. Since signal $S_1$ has a time varying amplitude $A_1$, the recorded error signals $S_e$ are obtained for various input signal amplitudes $A_1$. The error signals $S_e$ obtained are tabulated against bins or ranges of the function of the input signal amplitude $f(A_1)$ that is used to index the predistorter LUTs. Between predistorter updates, all error signals $S_e$ falling within the same bin are accumulated and averaged to derive a mean error for that bin. Notionally therefore, the table created by tabulating the error signals $S_e$ against $f(A_1)$ is a table of mean errors indexed by $f(A_1)$. The table of mean errors versus $f(A_1)$ can be filtered or curve-fitted to remove the effects of noise. The table of mean errors is then used to adjust the predistorter LUT values.

$$L_{G(n)}(f(A_1)) = L_{G(n-1)}(f(A_1)) - r \cdot A_{e(n-1)}(f(A_1)) \cdot \frac{1}{A_1}$$

$$L_{P(n)}(f(A_1)) = L_{P(n-1)}(f(A_1)) - r \cdot P_{e(n-1)}(f(A_1))$$

Alternatively, where the predistorter operates with in-phase and quadrature-phase LUTs, the look-up table values are adjusted using the following equations:

$$L_{I(n)}(f(A_1)) = L_{I(n-1)}(f(A_1)) - r \cdot I_{e(n-1)}(f(A_1)) \cdot \frac{1}{A_1}$$

$$L_{Q(n)}(f(A_1)) = L_{Q(n-1)}(f(A_1)) - r \cdot Q_{e(n-1)}(f(A_1)) \cdot \frac{1}{A_1}$$

In the four preceding equations, n−1 and n denote that the current LUT values (n−1) are used to produce the new LUT values (n).

The two pairs of equations above each describe a feedback control loop with the subtracted terms representing the feedback. The loop gain for each entry in the LUTs is defined as the ratio of the change in the feedback term to the change in the LUT value, i.e.

$$\frac{\Delta \text{feedback term}}{L_{x(n)} - L_{x(n-1)}}$$

where x is G, P, I or Q as appropriate. In the case of each of the four feedback control loop equations above, it can be shown that the loop gain is approximately proportional to r and is independent of the input signal amplitude $A_1$ (provided that the effect of the amplifier non-linearity is ignored). The independence of the loop gain from $A_1$ is due to the term $$\frac{1}{A_1}$$

which appears in the feedback equations except that for $L_{P(n)}$. Using the above equations, the LUT values are updated for all values of the index $f(A_1)$. The revised LUT values can be filtered or curve-fitted to remove the effects of noise if desired.

The control unit 24 is able to vary the size of the loop gain by varying the size of r in response to the magnitude of the error vector $S_e$. If the distortion is judged to be high then the loop gain is made relatively large by setting r to a relatively large value so that the LUT values converge quickly to a solution which minimises the distortion in signal $S_2$. On the other hand, if the distortion in $S_2$ is low, then the LUT values are already approximately correct and a relatively small loop gain is selected by setting r to a relatively small value so that the effects of system noise and spurious signals on the shape of the look-up tables are minimised. The preferred method for setting r is to use a mathematical function to generate a number based on the mean error table information. For example, a sum of squares calculation may be performed on the mean errors in the table. A large result implies a large amount of distortion at the amplifier output and hence that a large loop gain is required to arrive at a solution for the LUT values. A small result implies that there is only a small amount of distortion in the output of the amplifier and hence that a small loop gain is required, giving slower convergence of the LUT values.

Figure 3:
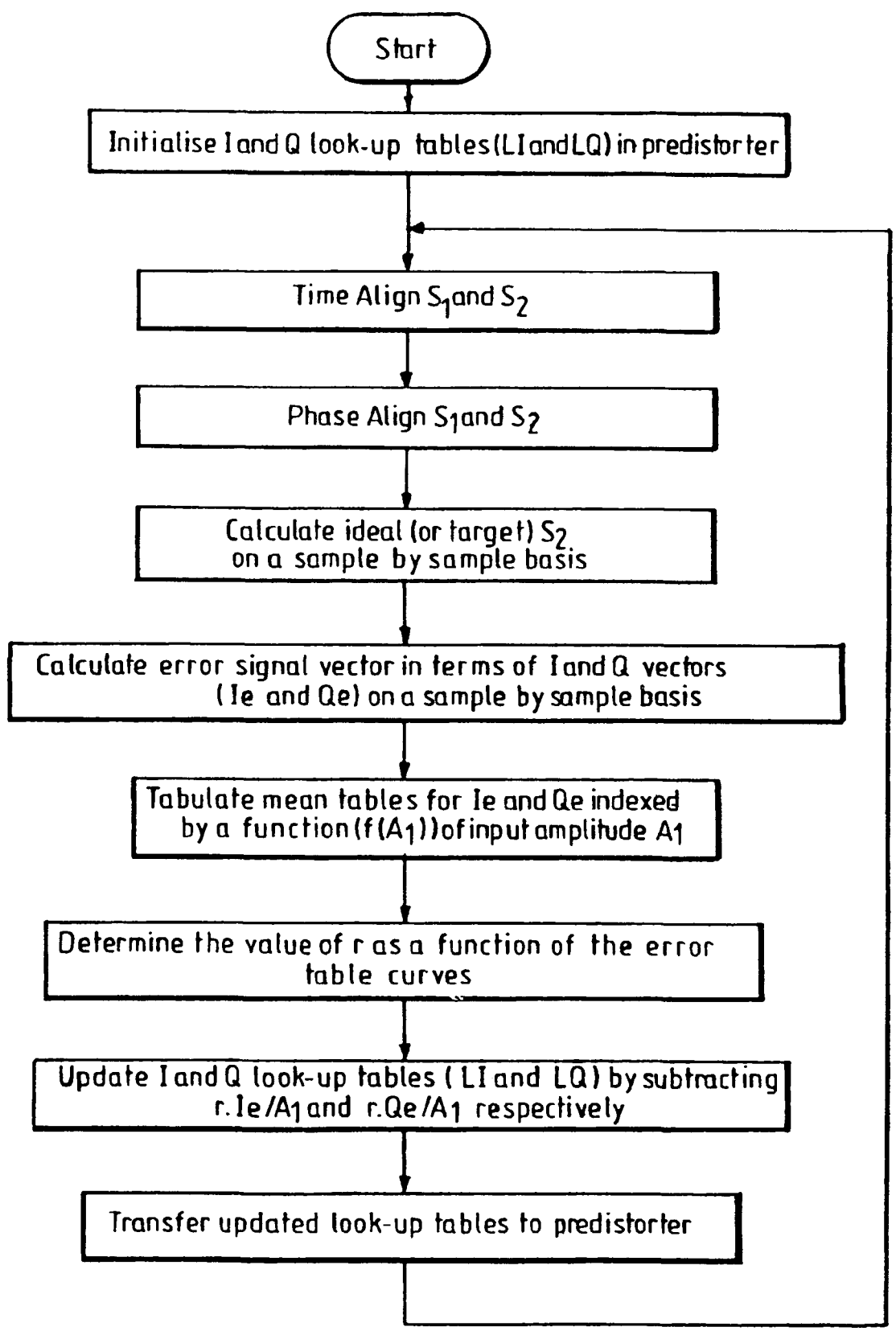
FIG. 3 is a flowchart illustrating a routine for adapting a predistorter which operates according to a quadrature signal format.

FIG. 3 is a flowchart which further explains the process of updating predistorter LUT values in the case where in-phase and quadrature LUTs are used.

Figure 4:
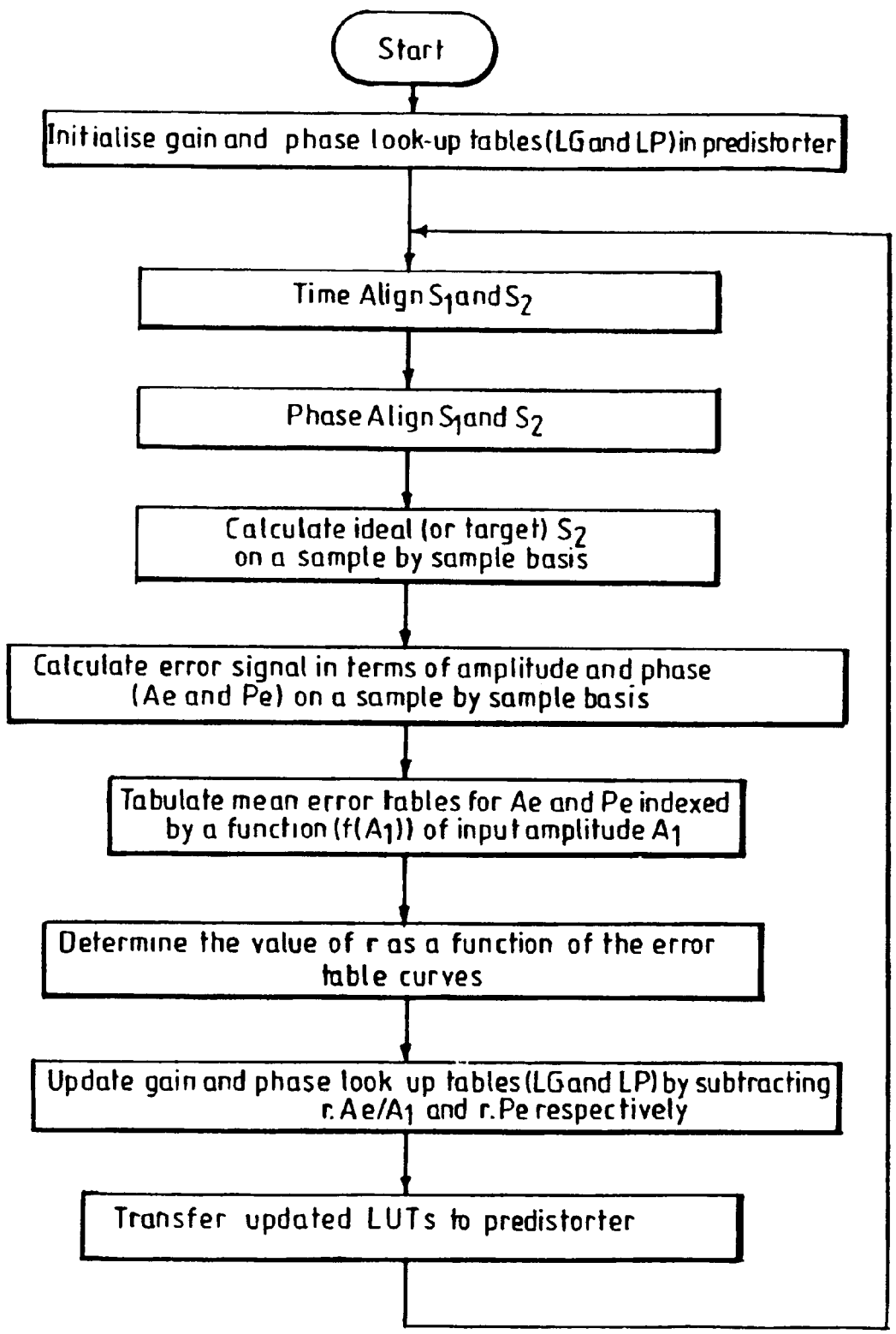
FIG. 4 is a flowchart illustrating a routine for adapting a predistorter which operates according to an amplitude and phase signal format.

FIG. 4 is a flowchart further explaining the process of updating predistorter values in the case where amplitude and phase LUTs are used.

In the embodiments described above, the predistorters are vector predistorters which are capable of reducing both AM (amplitude modulation) to AM distortion and AM to PM (phase modulation) distortion. It will be apparent to the skilled person that the predistorter could be a scalar predistorter which counteracts only either AM to AM or AM to PM distortion by providing only a gain or phase LUT respectively with the result that only gain or phase errors need to be tabulated for subsequently adjusting the LUT values.

The invention claimed is:

1. A method for updating a first look-up table (LUT) used by distortion counteracting equipment to counteract distortion in signal handling equipment, the method comprising:
   generating an error signal between (1) an output signal generated by the signal handling equipment based on an input signal having an amplitude and (2) a desired output signal for the signal handling equipment;
   generating a ratio by dividing the error signal by the amplitude of the input signal; and
   updating the first LUT based on the ratio of the error signal to the amplitude of the input signal.

2. The invention of claim 1, wherein:
   the distortion counteracting equipment uses the first LUT to counteract amplitude distortion in the signal handling equipment; and
   the first LUT is updated based on a ratio of amplitude of the error signal to the amplitude of the input signal.

3. The invention of claim 2, wherein:
   the distortion counteracting equipment uses a second LUT to counteract phase distortion in the signal handling equipment; and
   the second LUT is updated based on phase of the error signal independent of the amplitude of the input signal.

4. The invention of claim 1, wherein:
   the distortion counteracting equipment uses the first LUT to counteract in-phase distortion in the signal handling equipment; and
   the first LUT is updated based on a ratio of an in-phase component of the error signal to the amplitude of the input signal.

5. The invention of claim 4, wherein:
   the distortion counteracting equipment uses a second LUT to counteract quadrature distortion in the signal handling equipment; and
   the second LUT is updated based on a ratio of a quadrature component of the error signal to the amplitude of the input signal.

6. The invention of claim 1, wherein:
   the distortion counteracting equipment uses the first LUT to counteract quadrature distortion in the signal handling equipment; and
   the first LUT is updated based on a ratio of a quadrature component of the error signal to the amplitude of the input signal.

7. The invention of claim 1, wherein:
a plurality of error signals are generated over time;
a plurality of average error signals are generated for different amplitudes of the input signal; and
the first LUT is updated based on a plurality of ratios, each ratio being a ratio of one of the plurality of average error signals to the corresponding amplitude of the input signal.

8. The invention of claim 7, wherein the updating of the first LUT is further based on a loop gain parameter that is a function of the plurality of average error signals and is independent of the amplitude of the input signal.

9. The invention of claim 8, wherein the distortion counteracting equipment updates the loop gain parameter based on magnitude of the function of the plurality of average error signals.

10. The invention of claim 8, wherein the loop gain value is selected based on a sum of squares of the plurality of average error signals, such that the magnitude of the loop gain parameter is proportional to the magnitude of the sum of the squares of the plurality of average error signals.

11. The invention of claim 8, wherein the first LUT is updated according to:

$$L_{X(n)}(f(A_1)) = L_{X(n-1)}(f(A_1)) - r \cdot X_{e(n-1)}(f(A_1)) \cdot \frac{1}{A_1},$$

where:
$A_1$ is the amplitude of the input signal;
$f(A_1)$ is a specified function of the amplitude $A_1$;
$L_{X(n-1)}(f(A_1))$ is the previous value stored in the first LUT for index $f(A_1)$;
$L_{X(n)(f(A1))}$ is the updated value stored in the first LUT for index $f(A_1)$;
$r$ is the loop gain parameter; and
$X_{e(n-1)}(f(A_1))$ is the average error signal corresponding to $f(A_1)$).

12. The invention of claim 11, wherein:
the distortion counteracting equipment uses the first LUT to counteract amplitude distortion in the signal handling equipment; and
$X_{e(n-1)}(f(A_1))$ is amplitude of the average error signal corresponding to $f(A_1)$).

13. The invention of claim 12, wherein:
the distortion counteracting equipment uses a second LUT to counteract phase distortion in the signal handling equipment; and
the second LUT is updated according to:

$$L_P(f(A_1))=L_{P(n-1)}(f(A_1))-r \cdot P_{e(n-1)}(f(A_1)),$$

where:
$L_{P(n-1)}(f(A_1))$ is the previous value stored in the second LUT for index $f(A_1)$;
$L_{P(n)(f(A1))}$ is the updated value stored in the second LUT for index $f(A_1)$; and
$P_{e(n-1)}(f(A_1))$ is phase of the average error signal corresponding to $f(A_1)$).

14. The invention of claim 11, wherein:
the distortion counteracting equipment uses the first LUT to counteract in-phase distortion in the signal handling equipment; and
$X_{e(n-1)}(f(A_1))$ is an in-phase component of the average error signal corresponding to $f(A_1)$).

15. The invention of claim 11, wherein:
the distortion counteracting equipment uses the first LUT to counteract quadrature distortion in the signal handling equipment; and
$X_{e(n-1)}(f(A_1))$ is a quadrature component of the average error signal corresponding to $f(A_1)$).

16. The invention of claim 1, wherein:
the signal handling equipment is an amplifier; and
the distortion counteracting equipment is a predistorter that predistorts the input signals prior to being applied to the amplifier.

17. Distortion counteracting equipment for linearizing signal handling equipment using a first LUT to counteract distortion in the signal handling equipment, the distortion counteracting equipment adapted to:
generate an error signal between (1) an output signal generated by the signal handling equipment based on an input signal having an amplitude and (2) a desired output signal for the signal handling equipment;
generate a ratio by dividing the error signal by the amplitude of the input signal; and
update the first LUT based on the ratio of the error signal to the amplitude of the input signal.

18. The invention of claim 17, wherein:
the signal handling equipment is an amplifier; and
the distortion counteracting equipment is a predistorter that predistorts the input signals prior to being applied to the amplifier.

19. A system comprising:
signal handling equipment adapted to generate an output signal based on an input signal having an amplitude; and
distortion counteracting equipment adapted to linearize the signal handling equipment using a first LUT to counteract distortion in the signal handling equipment, the distortion counteracting equipment adapted to:
generate an error signal between (1) the output signal generated by the signal handling equipment and (2) a desired output signal for the signal handling equipment;
generate a ratio by dividing the error signal by the amplitude of the input signal; and
update the first LUT based on the ratio of the error signal to the amplitude of the input signal.

20. The invention of claim 19, wherein:
the signal handling equipment is an amplifier; and
the distortion counteracting equipment is a predistorter that predistorts the input signals prior to being applied to the amplifier.

21. A method for updating a first look-up table (LUT) used by distortion counteracting equipment to counteract distortion in signal handling equipment, the method comprising:
generating an error signal between (1) an output signal generated by the signal handling equipment based on an input signal having an amplitude and (2) a desired output signal for the signal handling equipment; and
updating the first LUT based on a ratio of the error signal to the amplitude of the input signal, wherein:
the distortion counteracting equipment uses the first LUT to counteract amplitude distortion in the signal handling equipment;
the first LUT is updated based on a ratio of amplitude of the error signal to the amplitude of the input signal;

the distortion counteracting equipment uses a second LUT to counteract phase distortion in the signal handling equipment; and the second LUT is updated based on phase of the error signal independent of the amplitude of the input signal.

22. A method for updating a first look-up table (LUT) used by distortion counteracting equipment to counteract distortion in signal handling equipment, the method comprising:

generating an error signal between (1) an output signal generated by the signal handling equipment based on an input signal having an amplitude and (2) a desired output signal for the signal handling equipment; and updating the first LUT based on a ratio of the error signal to the amplitude of the input signal, wherein:

the distortion counteracting equipment uses the first LUT to counteract in-phase distortion in the signal handling equipment; and the first LUT is updated based on a ratio of an in-phase component of the error signal to the amplitude of the input signal.

23. The invention of claim 22, wherein:

the distortion counteracting equipment uses a second LUT to counteract quadrature distortion in the signal handling equipment; and the second LUT is updated based on a ratio of a quadrature component of the error signal to the amplitude of the input signal.

24. A method for updating a first look-up table (LUT) used by distortion counteracting equipment to counteract distortion in signal handling equipment, the method comprising:

generating an error signal between (1) an output signal generated by the signal handling equipment based on an input signal having an amplitude and (2) a desired output signal for the signal handling equipment; and updating the first LUT based on a ratio of the error signal to the amplitude of the input signal, wherein:

the distortion counteracting equipment uses the first LUT to counteract quadrature distortion in the signal handling equipment; and the first LUT is updated based on a ratio of a quadrature component of the error signal to the amplitude of the input signal.

25. A method for updating a first look-up table (LUT) used by distortion counteracting equipment to counteract distortion in signal handling equipment, the method comprising:

generating an error signal between (1) an output signal generated by the signal handling equipment based on an input signal having an amplitude and (2) a desired output signal for the signal handling equipment; and updating the first LUT based on a ratio of the error signal to the amplitude of the input signal, wherein:

a plurality of error signals are generated over time;

a plurality of average error signals are generated for different amplitudes of the input signal; and the first LUT is updated based on a plurality of ratios, each ratio being a ratio of one of the plurality of average error signals to the corresponding amplitude of the input signal.

26. The invention of claim 25, wherein the updating of the first LUT is further based on a loop gain parameter that is a function of the plurality of average error signals and is independent of the amplitude of the input signal.

27. The invention of claim 26, wherein the distortion counteracting equipment updates the loop gain parameter based on magnitude of the function of the plurality of average error signals.

28. The invention of claim 26, wherein the loop gain value is selected based on a sum of squares of the plurality of average error signals, such that the magnitude of the loop gain parameter is proportional to the magnitude of the sum of the squares of the plurality of average error signals.

29. The invention of claim 26, wherein the first LUT is updated according to:

$$L_{X(n)}(f(A_1)) = L_{X(n-1)}(f(A_1)) - r \cdot X_{e(n-1)}(f(A_1)) \cdot \frac{1}{A_1},$$

where:

$A_1$ is the amplitude of the input signal;

$f(A_1)$ is a specified function of the amplitude $A_1$;

$L_{X(n-1)}(f(A_1))$ is the previous value stored in the first LUT for index $f(A_1)$;

$L_{X(n)}(f(A_1))$ is the updated value stored in the first LUT for index $f(A_1)$;

$r$ is the loop gain parameter; and $X_{e(n-1)}(f(A_1))$ is the average error signal corresponding to $f(A_1)$.

30. The invention of claim 29, wherein:

the distortion counteracting equipment uses the first LUT to counteract amplitude distortion in the signal handling equipment; and $X_{e(n-1)}(f(A_1))$ is amplitude of the average error signal corresponding to $f(A_1)$.

31. The invention of claim 30, wherein:

the distortion counteracting equipment uses a second LUT to counteract phase distortion in the signal handling equipment; and the second LUT is updated according to:

$$L_{P(n)}(f(A_1)) = L_{P(n-1)}(f(A_1)) - r \cdot P_{e(n-1)}(f(A_1)),$$

where:

$L_{P(n-1)}(f(A_1))$ is the previous value stored in the second LUT for index $f(A_1)$;

$L_{P(n)}(f(A_1))$ is the updated value stored in the second LUT for index $f(A_1)$; and $P_{e(n-1)}(f(A_1))$ is phase of the average error signal corresponding to $f(A_1)$.

32. The invention of claim 29, wherein:

the distortion counteracting equipment uses the first LUT to counteract in-phase distortion in the signal handling equipment; and $X_{e(n-1)}(f(A_1))$ is an in-phase component of the average error signal corresponding to $f(A_1)$.

33. The invention of claim 29, wherein:

the distortion counteracting equipment uses the first LUT to counteract quadrature distortion in the signal handling equipment; and $X_{e(n-1)}(f(A_1))$ is a quadrature component of the average error signal corresponding to $f(A_1)$.

* * * * *

UNITED STATES PATENT AND TRADEMARK OFFICE
CERTIFICATE OF CORRECTION

| | | |
|---|---|---|
| PATENT NO. | : 7,042,286 B2 | Page 1 of 1 |
| APPLICATION NO. | : 10/480895 | |
| DATED | : May 9, 2006 | |
| INVENTOR(S) | : Steven Anthony Meade et al. | |

It is certified that error appears in the above-identified patent and that said Letters Patent is hereby corrected as shown below:

Column 7, on line 35, replace the equation "$L_{X(n)(f(A1))}$" with --$L_{X(n)}(f(A_1))$--.

Column 7, online 52, replace the equation

"$L_P(f(A_1))=L_{P(n-1)}(f(A_1))$-r $\cdot P_{e(n-1)}(f(A_1))$," with --$L_{P(n)}(f(A_1))=L_{P(n-1)}(f(A_1))$-r $\cdot P_{e(n-1)}(f(A_1))$,--.

Column 7, on line 57, replace the equation

"$L_{P(n)(f(A1))}$" with --$L_{P(n)}(f(A_1))$--.

Column 10, on line 25, replace the equation

"$L_{X(n)(f(A1))}$" with --$L_{X(n)}(f(A_1))$--.

Column 10, on line 47, replace the equation

"$L_{P(n)(f(A1))}$" with --$L_{P(n)}(f(A_1))$--.

Signed and Sealed this

Fifteenth Day of August, 2006

JON W. DUDAS
*Director of the United States Patent and Trademark Office*